United States Patent [19]
Asakawa et al.

[11] 3,936,307
[45] Feb. 3, 1976

[54] LIGHT AND HEAT SENSITIVE COMPOSITION FOR PRODUCING A COLORED TRANSFER COMPLEX IMAGE

[75] Inventors: Shirow Asakawa; Katsue Hasegawa; Reiji Sano; Shunsuke Matsuda, all of Kawasaki, Japan

[73] Assignee: Matsushita Electric Industrial Co., Ltd., Kadoma, Japan

[22] Filed: Aug. 2, 1973

[21] Appl. No.: 384,925

[30] Foreign Application Priority Data
Aug. 3, 1972 Japan............................ 47-78127

[52] U.S. Cl.................... 96/90 R; 96/88; 96/115 P; 96/48 HD
[51] Int. Cl.$^2$........................ G03C 1/00; G03C 1/68
[58] Field of Search ..... 96/90 R, 115 P, 88, 48 HD; 250/316

[56] References Cited
UNITED STATES PATENTS
3,607,266   9/1971   Yamada et al...................... 96/90 R
3,697,276   10/1972  Lewis et al.......................... 96/90 R
3,790,376   2/1974   Hashiue et al...................... 96/90 R OTHER PUBLICATIONS
IBM Technical Disclosure Bulletin, Vol. 9, No. 11 p. 1488.

Primary Examiner—Won H. Louie, Jr.

[57] ABSTRACT

A light and heat sensitive composition useful particularly in photographic reproduction, the composition comprising a combination of an electron donative material, such as a $\pi$-base and an electron acceptive material such as a $\pi$-acid both dispersed in an aqueous dispersion medium in the form of discrete particles, at least one of the electron donative and electron acceptive materials being capable of polymerization upon irradiation by actinic light or an actinic corpuscular ray and the materials producing a colored charge transfer complex under predetermined heating conditions.

9 Claims, No Drawings

LIGHT AND HEAT SENSITIVE COMPOSITION FOR PRODUCING A COLORED TRANSFER COMPLEX IMAGE

This invention relates to a photographic composition which is sensitive to a radiation such as of light or heat, or a corpuscular ray such as an electron beam, and more particularly to novel and unique photographic compositions containing organic substances, which are useful in recording an image by the use of the radiation or corpuscular ray and which are suitable for photographic reproduction purposes.

The radiations as herein used are intended to generically mean electromagnetic radiations emitted from an object, including $\gamma$-ray, X-rays, visible light rays, infrared rays and ultra-violet rays. The corpuscular rays as herein used are intended to generically means a stream of particles, charged or not charged, flowing in one direction with a narrow width, including streams of atom, molecule, and ions thereof, atomic nucleus, electron and/or neutron, i.e., $\alpha$-ray, $\beta$-ray or cathode rays.

Generally, image-forming organic materials used in photographic systems are broadly classified into three categories by the particular kinds of organic materials employed: (1) materials sensitive to light, (2) materials sensitive to heat, and (3) materials sensitive to both light and heat.

With regard to materials sensitive to light, U.S. Pat. No. 3,476,562 describes compositions which are particularly useful in print-out photography. The compositions comprise an organic halogen compound and an N-vinyl compound or an aryl amine as main components thereof. These compounds are coreacted in response to actinic light for producing colors. For example, N-vinyl carbazole, carbon tetrachloride, water and gelatin are mixed together, with violent agitation, to form a dispersion, which is then applied onto a sheet of baryta-coated paper and dried to obtain a light sensitive sheet. In order to obtain a print out picture, the thus obtained light sensitive sheet is initially subjected to image-wise exposure to light having a wavelength of 4,000 – 7,800 A, and then to development by the use of actinic near ultraviolet light having a wavelength of 3,000 – 4,000 A, followed by heating to about 70°C for fixing the developed image on the sheet. In short, the photographic system of the U.S. Pat. No. 3,476,562 involves exposing a light sensitive material-coated sheet to light in two steps, and heating the exposed sheet to obtain a positive or negative image. This is well known as a thoroughly dry-type photographing method.

Various heat sensitive photographic systems involving a thermal color-forming reaction between two or more materials have also been known, including a system using crystal violet and bisphenol. Furthermore, in IBM Technical Disclosure Bulletin Vol. 9, No. 11, Page 1488, a photographic system is described which employs a heat sensitive composite containing hexamethylbenzene and tetracyanoethylene. The image-producing or color-forming principle of these heat sensitive systems is to utilize a thermal reaction between two colorless materials, i.e., electron donative and electron acceptive materials which produce a colored charge-transfer complex.

Furthermore, with regard to photographic materials sensitive to both light and heat, Eastman Kodak Co. have proposed light and/or heat sensitive compositions for use on photographic films, which comprise an oxidizing and reducing image-forming combination of a heavy metal salt of an organic carboxylic acid and a mixture of a major portion of a reducing agent and a minor portion of merocyanine dye.

Though various kinds of heat and/or light sensitive materials or compositions are known as described hereinbefore, the present invention has for its main object the provision of a photographic composition which is novel in chemical and/or physical aspects and in image-forming and color-developing principles and which is capable of recording an image in two-steps, i.e., exposure by the use of an actinic light ray or a corpuscular ray and development by heating.

It is a further object of the present invention to provide a photographic composition which is excellent in photosensitivity and thus photographic results.

According to the present invention, there is provided a light and heat sensitive composition which comprises an electron donative material (hereinafter referred to simply as a "donor") or a $\pi$-base and an electron acceptive material (hereinafter referred to as an "acceptor") or a $\pi$-acid, both dispersed in the form of discrete particles in a solid hydrophilic film-forming vehicle in which the $\pi$-base and $\pi$-acid are substantially insoluble, at least one of the $\pi$-base and $\pi$-acid being polymerized upon exposure to an actinic ray, and the $\pi$-base and $\pi$-acid producing a colored charge transfer complex under predetermined heating conditions.

An essential feature of the present invention is that a light and heat sensitive system using a particular combination of a donor or $\pi$-base and an acceptor or $\pi$-acid involves two different reactions, i.e., a polymerization reaction and a heat reaction for producing a colored charge transfer complex, and that the difference between the melting points of the $\pi$-base and $\pi$-acid is greater than 10°C. In other words, at least one of the donor and acceptor is polymerized upon exposure to an actinic ray, and the donor and acceptor can form a colored charge transfer complex when fusingly mixed with each other in a molecular state under predetermined heating conditions. In order to fusingly mix the two components with each other, it is required to carry out color development at a temperature between the melting points of the two components. In addition, the donor and/or acceptor once exposed turns into a polymerized material or materials which have melting points far higher than the respective original donor and/or acceptor, so that there is no possibility of the polymerized donor and/or acceptor forming a colored charge transfer complex with non-polymerizable or non-polymerized acceptor and/or donor unless heated up to a temperature level higher than the melting point of the component of a higher melting point.

In application, the composition of the present invention is coated on a suitable substrate or supporting means, preferably in the form of a sheet, and dried to obtain a light and heat sensitive layer coated thereon. In order to record an image in the light and heat sensitive layer-coated substrate, the layer is exposed to actinic light through an image pattern for forming a latent image or for polymerizing the polymerizable component or components (donor and/or acceptor) contained in the exposed image areas. Then, the exposed sheet is heated to a predetermined temperature, i.e., at a temperature higher than the melting point of the polymerizable component but lower than the melting point of the non-polymerizable component if only one component is polymerizable, or at a temperature between melting points of the two components if both are polymerizable, for fusingly mixing the polymerizable component in non-exposed image areas with the non-polymerizable component in a molecular state. This mixing in a molecular state of the donor and acceptor in the non-exposed image areas results in formation of a colored charge transfer complex. While, no color develops in the exposed areas since the polymerized material is not melted under such low heating conditions and can not thus react with the other counter component.

In order to obtain an image picture of clear and distinct contrast, it is preferred that if one component is polymerizable, the polymerizable component has a melting point at least 10°C lower than the that of the non-polymerizable component, or if both are polymerizable, the difference in melting points of the two components is at least 10°C. This will be described in more detail hereinafter.

When the donor and acceptor as employed in the present invention are associated with each other in a molecular state, a colored charge transfer complex is readily formed. However, no colored charge transfer complex is formed when these two materials are held in contact or coexistence with each other in the form of discrete particles. In order to permit the association of the donor with the acceptor in a molecular state, it is sufficient to mix these materials with each other in a gaseous, liquefying or fusing state at a color-developing or image-forming stage. In the present invention, such association is suitably established, as described hereinbefore, by fusing one component having a lower melting point under predetermined heating conditions for dissolving therein the counter component to produce a color.

The light and heat sensitive composition of the present invention can be prepared in the following manner. Either a donor or acceptor is first introduced into an aqueous dispersion medium containing a film-forming vehicle with sufficient agitation to obtain a dispersion. Then, the other component is further added to the dispersion together with a suitable additive, if desired, to obtain a dispersion wherein the donor and acceptor components are dispersed in the form of discrete particles. It is essentially required that the donor and acceptor components are substantially insoluble in the aqueous dispersion medium so as not to permit association of both components in molecular states at this dispersion stage. In this connection it is preferred that particles of the donor or acceptor components which is first introduced into an aqueous dispersion medium be suitably discretely dispersed by the use of a known microcapsulating or protective-colloidal technique. The particles to be introduced have preferably a size as small as $10\mu$.

Then, the dispersion containing discrete particles of the donor and acceptor is applied onto a suitable sheet or substrate, including a sheet of baryta-coated paper, a glass plate, etc., and dried to obtain a light and heat sensitive recording medium.

In order to ensure high sensitivity to an actinic ray of the recording medium, only if one component is polymerizable, the donor and acceptor are preferably dispersed separately in a similar aqueous dispersion medium containing a film-forming vehicle thereby to form two dispersions, one containing the donor and the other the acceptor. In this case, one dispersion containing a non-polymerizable component which may be either a donor or an acceptor is initially coated on a suitable sheet and dried. Then, the other dispersion which contains a polymerizable component is applied over the first-formed coating or layer of the non-polymerizable component for enhancing sensitivity to an actinic ray of the resultant light and heat sensitive sheet.

When the light and heat sensitive sheet is exposed to an actinic ray through an image pattern, the polymerizable component or components (a donor and/or acceptor) are polymerized in the exposed image areas.

Then, the exposed sheet is heated to a temperature higher than the melting point of the polymerizable or one component and lower than the melting point of the non-polymerizable or the other component having a melting point higher than that of the former for bringing the donor with the acceptor into association in a molecular state. The component of a lower melting point existing in the non-exposed image areas is melted or fused and reacts with the other counter component dissolved therein, forming a colored charge transfer complex. It is to be noted that the melting point of the non-polymerizable component or components having a higher melting component is preferred to be at least 10°C higher than that of the polymerizable or the other component. By heating the exposed sheet at a temperature level between the melting points of the two components, the polymerized material is not melted and thus does not react with the non-polymerizable or other counter component, since the polymer has a melting point far higher than the temperature level employed in the thermal treatment and the component of a higher melting point is also not melted at such heating temperatures.

As is apparent from the foregoing, by heating the photographic material-coated sheet at a temperature higher than a melting point of the polymerizable component or components of a lower melting point but lower than a melting point of the non-polymerizable component or components, having a higher melting point, the former existing in the unexposed image areas is fused and dissolves therein the latter to form a colored charge transfer complex. On the other hand, the exposed and polymerized material is not fused by heating under such conditions as well as the non-polymerizable component or components having a higher melting point, thus with no color-formation occurring in the exposed areas. Accordingly, when a photographic sheet coated with the composition of the present invention is exposed to an actinic ray through a suitable image pattern and then properly heated, the exposed image portions are not colored but the no-exposed image portions show distinctive coloration, thereby producing an image picture corresponding to the image pattern.

It has been found that if the difference between the melting points of the donor and acceptor is greater than 10°C, color development can be conducted satisfactorily without paying special attention to a heating source or a heating manner. However, with a temperature difference smaller than 10°C, polymerized portions may also disadvantageously be colored, unless temperatures applied are exactly controlled by the use of a particular heating source which allows high-precision control of the treating temperatures. Moreover, the melting point $T_p$, of polymerized material or polymer produced is required to be at least 10°C higher than that of the non-polymerizable material having a higher melting point for producing a distinct, clear picture image. For instance, if the acceptor is assumed to be a polymerizable or lower melting point material and the donor to be a non-polymerizable or higher melting point material, it is preferred that the following relationships are held between the acceptor melting point, $T_A$ the donor melting point $T_D$ and the polymer melting point $T_P$.

$$T_A + 10°C < T_D$$
$$T_D + 10°C < T_P$$

It should be noted that if the donor is a polymerizable or lower melting point material and the acceptor is a non-polymerizable or higher melting point material, the relationship between $T_D$ and $T_A$ will be reversed.

At least one of the donor and acceptor as used in the practice of the present invention is preferred to have a vinyl group which is capable of polymerization with aid of an actinic ray. Additionally, a polymerization initiator or a photosensitizer which has excellent sensitivity to light of a predetermined wavelength and causes a polymerization reaction to a donor and/or acceptor may be added. In this case, it is necessary that the initiator or sensitizer has a melting point 10°C or more, higher than that of the polymerizable or lower melting point component. Examples of the initiator include uranyl nitrate, benzil, a combination of eosin and ascorbic acid, $CuClO_4$, etc.

The donors useful in the present invention are, for example, $\pi$-bases including nitrogen-containing aromatic compounds or other aromatic compounds containing therein a donative group: N-vinylcarbazole, vinylanthracene, N-benzylacrylamide, N-methoxyphenylmethaacrylamide, $\beta$-naphthylvinyl ether, p-phenylstyrene, vinyldiphenylamine, acenaphthylene, vinyl fluorene, $\beta$-vinylnaphthalene, 2-vinylphenanthrene, 3-vinylphenanthrene, 1-vinylpyrene and p-phenylenediacrylpropionate as a polymerizable material; and $\beta$-naphthylamine, 1,6-diaminopyrene, phenothiazine, dibenzophenothiazine, acridine, phenazine, o-phenanthroline, tetramethylbenzene, anthracene, benzidine, and diaminodiphenylamine as a non-polymerizable component.

The acceptors which are useful in the present invention are preferred to be $\pi$-acids which have a double bond conjugated with an electron attractive group: tetrabromoethylene, 1,2-dibromo-1-iodoethylene, and $\alpha$-chloro-3,5-dinitrostyrene as a polymerizable component; and tetracyanoquinodimethane, tetracyanoethylene, chloranil, bromanil, quinone, anthraquinone, 2,4,7-trinitrofluorenone, trinitrobenzene, and tetranitropyrene as a non-polymerizable component.

As described hereinbefore, the difference between the melting points of the two components is preferred to be greater than 10°C, for conducting color development in a satisfactory manner. In this sense, the aforementioned compounds should be properly selected in combination in practical applications. For instance, where the donor or $\pi$-base is a polymerizable material such as N-vinylcarbazole [melting point (hereinafter referred to simply as M.P.) 65°C], vinylanthracene (M.P. 68°C), n-benzylacrylamide (M.P. 66°C) $\beta$-naphthylvinyl ether (M.P. 54°C), $\beta$-vinylnaphthalene (M.P. 66°C), 3-vinylphenanthrene (M.P. 35°C), N-p-methoxyphenylmethacrylamide (M.P. 91°C), acenaphthylene (M.P. 93°C), vinyl fuorene (M.P. 92°C) 2-vinylphenanthrene (M.P. 96°C), 1-vinylpyrene (M.P. 88°C) or p-phenylenediacrylpropionate (M.P. 83°C), there is used in combination as a non-polymerizable acceptor or $\pi$-acid tetracyanoquinodimethane (M.P. 293°C), tetracyanoethylene (M.P. 199°C), chloranil (M.P. 290°C), bromanil (M.P. 151°C), quinone (M.P. 116°C), anthraquinone (M.P. 286°C), 2,4,7-trinitrofluorene (M.P. 175°C), trinitrobenzene (M.P. 123°C), or tetranitropyrene (decomposition point 330°C). Furthermore, where p-phenylstyrene which has a relatively high melting point of 119°C is used as a polymerizable donor, the above-mentioned non-polymerizable acceptors except quinone can be preferably employed. Additionally, where polymerizable acceptors or $\pi$-acids including tetrabromoethylene (M.P. 57°C), 1,2-dibromo-1-iodoethylene (M.P. 66°C) and $\alpha$-chloro-3,5-dinitrostyrene (M.P. 56°C) are used, the following donors or $\pi$-bases can be suitable selected for use in combination with the $\pi$-acids: $\beta$-naphthylamine (M.P. 111°–113°C), 1,6-diaminopyrene (M.P. 156°C), phenothiazine (M.P. 185°C), dibenzophenothiazine (M.P. 236°C), acridine (110°C), phenazine (M.P. 171°C), o-phenanthroline (M.P. 94°C), tetramethylbenzene (M.P. 80°C), anthracene (M.P. 218°C), benzidine (M.P. 115°–120°C), and diaminodiphenylamine (M.P. 158°C) as a non-polymerizable $\pi$-base; and N-p-methoxyphenylmethacrylamide (M.P. 91°C), p-phenylstyrene (M.P. 119°C), acenaphthylene (M.P. 93°C), vinylfluorene (M.P. 92°C), and 2-vinylphenanthrene (M.P. 96°C) as a polymerizable $\pi$-base.

Various kinds of film-forming vehicles are usable in present invention, including natural film-forming materials such as gelatin, casein, alginate, gums, starch derivatives and the like materials, and synthetic film-forming materials such as polyvinyl alcohol, water-soluble polyacrylics, various amine or aldehyde resins, and other water-soluble resins. These film-forming materials should be water-soluble. The donor and acceptor should not be dissolved in the film-forming vehicle. Furthermore, water is most suitable as a dispersing medium.

The above discussed and other features and advantages of the present invention will become clear from the following examples which illustrates the invention in a particular manner.

EXAMPLE 1

10g of polyvinyl alcohol serving as a dispersing or film-forming vehicle was introduced into 80ml of water which was used as a solvent for the alcohol, to which was dropped 0.03g of a defoaming agent. Then, 10g of tetracyanoquinodimethane which was used as an acceptor or a $\pi$-acid was mixed with the resultant solution while sufficiently agitating by means of an agitator, thereby obtaining a dispersion. While, 10g of N-vinyl carbazole which was employed as a donor or a $\pi$-base was sufficiently admixed with 0.5g of uranyl nitrate. The mixture was then introduced into the dispersion with sufficient agitation to obtain a dispersion. The thus obtained dispersion was uniformly applied onto a sheet of barytacoated paper by means of a doctor blade and dried in the air to obtain a light and heat sensitive sheet. The thus obtained light and heat sensitive sheet was then exposed through a positive film for 30 seconds to light from a 250W xenone lamp at a distance of 30cm from the film and of a wave-length in the vicinity of 4,000 A. After the exposure, the resultant sheet was heated for 30 seconds at 80°C in a heating developer to form a dark or black positive image. A maximum optical density of the resultant image was 2.0.

EXAMPLE 2

10g of polyvinyl alcohol employed as a film-forming vehicle was introduced into 80ml of water, to which 0.03g of a defoaming agent was dropwise added. Then, 10g of tetracyanoquinodimethane which was used as an acceptor or a $\pi$-acid was mixed with the resultant solution and agitated sufficiently by means of an agitator to obtain a first dispersion. The first dispersion was applied uniformly onto a sheet of baryta-coated paper and dried. While, a mixture of 10g of N-vinyl carbazole employed as a donor or a $\pi$-base and 0.1g of carbon tetrabromide employed as a photopolymerization initiator was introduced into another solution which had been previously prepared and contained 80ml of water, 10g of polyvinyl alcohol and 0.03g of a defoaming agent, and agitated sufficiently by means of an agitator to obtain a second dispersion. The thus obtained second dispersion was applied over the layer on the sheet which had been formed by the use of the first dispersion, and dried to obtain a highly light sensitive sheet. The light sensitive sheet thus obtained was exposed for 1 second through a positive film to light from a 250W xenone lamp at a distance of 30cm from the film and of a wavelength in the vicinity of 4,000 A. The exposed sheet was then heated at 80°C for 30 seconds to form a dark positive image having its maximum density of 2.0.

EXAMPLE 3

8g of gelatin serving as a film-forming vehicle was dissolved in 50ml of water, to which were added 12g of anthraquinone used as an acceptor or a $\pi$-acid and 0.03g of a defoaming agent. The resultant mixture was agitated sufficiently to obtain a dispersion. While, 10g of 9-vinylanthracene which was used as a donor or a $\pi$-base was microcapsulated by the use of a known microcapsulating technique. The microcapsulated 9-vinylanthracene was introduced into the dispersion and agitated sufficiently to obtain an ultimate dispersion. The ultimate dispersion was applied onto a glass plate having transparent electrodes and dried to obtain an electron beam recording plate. The recording plate was placed in a high vacuum container the inside of which was kept at $10^{-5}$ Torr. or over. Then, an electron beam which was accelerated at 5KV was irradiated partly upon the plate at $10^{-8}$ colomb/cm$^2$. Then, the irradiated plate was heated at 75°C to obtain a colored image, i.e., the electron beam-irradiated areas were colorless and the non-irradiated areas turned reddish brown.

In this example, since 9-vinylanthracene was polymerized by means of an electron beam, no colored charge transfer complex was formed in the beam-irradiated areas. Additionally, 9-vinylanthracene used as a polymerizable donor was microcapsulated, so that formation of a colored charge transfer complex was completely suppressed at a stage prior to the heating step. It will be appreciated that microcapsulation may be conducted for either a donor or an acceptor.

EXAMPLE 4

A mixture of 6g of polyvinylpyrrolidone and 0.02g of a defoaming agent was introduced into 50ml of water. 6g of $\beta$-naphthylamine used as a donor or a $\pi$-base was further added to the mixture and agitated by means of an agitator. To the resultant mixture were added 8g of $\alpha$-chloro-3,5,-dinitrostyrene and 0.005g of azoisobutyronitrile used as a photopolymerization accelerator with sufficient agitation thereby to obtain a dispersion. The thus obtained dispersion was uniformly applied onto a sheet of baryta-coated paper and dried to form a light sensitive sheet. The light sensitive sheet was exposed for 60 seconds through a positive film to light from a 250W xenone lamp and heated at 65°C to form a reddish brown positive image.

In any of the foregoing Examples, light sensitive sheets are subjected to exposure to light or electron beam, and then to thermal development for forming a colored image. However, the photographic composition of the present invention may be effectively used as a heat sensitive material, wherein a reproduced image may be fixed by exposure to light in a subsequent stage. The following two examples show the composition of the invention used as a heat sensitive material for reproducing a colored image without prior exposure to an actinic ray.

EXAMPLE 5

10g of tetracyanoquinodimethane having a melting point of 293°C was introduced as an acceptor or a $\pi$-acid into a solution which contained 80ml of water and 10g of polyvinyl alcohol, to which was dropwise added 0.03g of a defoaming agent. The resultant dispersion was agitated at a high speed by the use of an agitator, and then 10g of N-vinylcarbazole having a melting point of 68°C was added as a donor or a $\pi$-base to the dispersion with sufficient agitation to obtain a dispersion. The thus obtained dispersion was uniformly applied onto a sheet of baryta-coated paper and dried to obtain a heat sensitive sheet. The resultant sheet was brought into contact with a heating head of 80°C. Dark color appeared at the contacted portions since the donor and acceptor were combined together to form a dark or black colored charge transfer complex. Then, the resultant sheet was subjected for fixing to uniform exposure to light from a xenone lamp of a wavelength in the vicinity of 4,000 A. By this fixing, N-vinylcarbazole in the non-heated portions photo-polymerized, turning into a polymer having a melting point of 300°C or higher. Accordingly, light-fixed sheet became thermally stable at least up to 293°C which is the melting point of the acceptor used, so that even if the sheet was heated to a temperature as high as 100°C – 200°C, there appeared no thermal fogging of the image.

As is apparent from the foregoing Example 5, the light and heat sensitive sheet of the present invention becomes thermally stable after fixing by light. No fogging occurs even if heat is imposed spontaneously on the reproduced picture image thereafter. On the other hand, in prior-art heat sensitive sheets with incomplete fixing of a reproduced image, fogging occurs when the image-bearing sheet is subjected afterwards to a temperature to which the heat sensitive components are sensitized. Such fogging due to incomplete fixing can be well prevented in the present invention.

EXAMPLE 6

10g of tetracyanoquinodimethane having a melting point of 293°C was dispersed as an acceptor or a $\pi$-acid in a solution which contained 80ml of water and 10g of polyvinyl alcohol. 0.03g of a defoaming agent was further dropped to the dispersion. The resultant dispersion was agitated at high speed by means of an agitator, to which were added 10g of N-vinylcarbazole as a donor or a $\pi$-base having a melting point of 68°C, and 0.5g of uranyl nitrate and sufficiently agitated to obtain a dispersion. The resultant dispersion was uniformly applied onto a sheet of baryta-coated paper and dried to obtain a heat sensitive sheet. The thus obtained sheet was contacted with a heating head of 80°C, so that the contacted portions were turned into dark color since the donor and acceptor combined together to form a colored charge transfer complex. The color-formed sheet was allowed to stand under room light for photopolymerizing N-vinylcarbazole by the action of the photo-polymerization initiator. The resultant sheet became thermally stable due to fixing by exposure to the room light.

As is apparent from the foregoing Examples, the composition of the present invention comprises an electron donative material (donor) and an electron acceptive material (acceptor) which yield a colored charge transfer complex by the action of a heat radiation, and one of which is capable of polymerization with aid of actinic light or corpuscular rays, the resultant polymer being not capable of forming a charge transfer complex.

It should be noted that a light and heat sensitive sheet coated with the composition of the invention may be either initially exposed to actinic light or actinic corpuscular rays through an image pattern for polymerizing one of the donor and acceptor existing in the areas exposed, and then suitable heated for forming a colored charge transfer complex in the non-exposed areas, or initially heated for producing color in an image pattern, and then uniformly exposed to light for fixing, as the case may be.

What is claimed is:

1. A photosensitive composition essentially consisting of a dispersion phase in the form of discrete particles of (a) an aromatic compound having an electron donative group and being polymerizable upon exposure to actinic light and (b) an organic compound having a double bond conjugated with an electron attracting group relative to said electron donative group in a solid-hydrophilic-film-forming vehicle in which said combination is insoluble, said compound (a) being a compound selected from the group consisting of N-vinylcarbazole, vinylanthracene, N-benzylacrylamide, N-methoxyphenylmethaacrylamide, β-naphthylvinyl ether, p-phenylstyrene, vinyldiphenylamine, acenaphthylene, vinyl fluorene, β-vinylnaphthalene, 2-vinylphenanthrene, 3-vinylphenanthrene, 1-vinylpyrene and p-phenylenediacrylpropionate, said compound (b) being a compound selected from the group consisting of tetrabromoethylene, 1,2-dibromo-1-iodoethylene, α-chloro-3,5-dinitrostyrene, tetracyanoquinodimethane, tetracyanoethylene, chloranil, bromanil, quinone, anthraquinone, 2,4,7-trinitrofluorenone, trinitrobenzene, and tetranitropyrene, said combination being selected such that melting points of said compounds (a) and (b) differ from each other by more than 10°C and that said compounds (a) and (b) react with each other and produce a colored charge transfer complex when said combination is heated above the lower one of said melting points.

2. A photosensitive composition essentially consisting of a dispersion phase in the form of discrete particles of (a) an aromatic compound having an electron donative group and (b) an organic compound having a double bond conjugated with an electron attracting group relative to said electron donative group and being polymerizable upon exposure to actinic light in a solid-hydrophilic-film-forming vehicle in which said combination is insoluble, said compound (a) being a compound selected from the group consisting of β-naphthylamine, 1,6-diaminopyrene, phenothiazine, dibenzophenothiazine, acridine, phenazine, o-phenanthroline, tetramethylbenzene, anthracene, benzidine, and diaminodiphenylamine, said compound (b) being a compound selected from the group consisting of tetrabromoethylene, 1,2-dibromo-1-iodoethylene, α-chloro-3,5-dinitrostyrene, said combination being selected such that melting points of said compounds (a) and (b) are different from each other by more than 10°C and that said compounds (a) and (b) react with each other and produce a colored charge transfer complex when said combination is heated above the lower one of said melting points.

3. A photosensitive composition as claimed in claim 2, wherein said solid-hydrophilic-film-forming vehicle is selected from the group consisting of gelatin, casein, gums, starch derivatives, polyvinyl alcohol, water-soluble polyacryl acids and polyvinylpyrrolidone.

4. A photosensitive composition as claimed in claim 2, wherein said combination is admixed with a sensitizing amount of an additive capable of initiating photopolymerization of said compound (b), said additive having a melting point at least 10°C higher than the lower value of the respective melting points of said compounds.

5. A photosensitive composition as claimed in claim 1 wherein compound (a) is N-vinylcarbazole and compound (b) is tetracyanoquinodimethane.

6. A photosensitive composition as claimed in claim 1 wherein compound (a) is vinylanthracene and compound (b) is anthraquinone.

7. A photosensitive composition as claimed in claim 2 wherein compound (a) is β-naphthylamine and compound (b) is α-chloro-3,5-dinitrostyrene.

8. A photosensitive composition as claimed in claim 1, wherein said solid-hydrophilic-film-forming vehicle is selected from the group consisting of gelatin, casein, gums, starch derivatives, polyvinyl alcohol, water-soluble polyacryl acids and polyvinylpyrrolidone.

9. A photosensitive composition as claimed in claim 1, wherein said combination is admixed with a sensitizing amount of an additive capable of initiating photopolymerization of said compound (a), said additive having a melting point at least 10°C higher than the lower value of the respective melting points of said compounds.

* * * * *